United States Patent
Yang et al.

(10) Patent No.: US 10,816,601 B2
(45) Date of Patent: Oct. 27, 2020

(54) DIAGNOSING DEVICE OF THREE PHASE INVERTER

(71) Applicant: LSIS CO., LTD., Anyang-si, Gyeonggi-do (KR)

(72) Inventors: Chun-Suk Yang, Anyang-si (KR); Hong-Seok Kim, Anyang-si (KR)

(73) Assignee: LSIS CO., LTD., Anyang-si, Gyeonggi-Do (KR)

(*) Notice: Subject to any disclaimer, the term of this patent is extended or adjusted under 35 U.S.C. 154(b) by 114 days.

(21) Appl. No.: 15/919,707

(22) Filed: Mar. 13, 2018

(65) Prior Publication Data

US 2018/0267104 A1 Sep. 20, 2018

(30) Foreign Application Priority Data

Mar. 17, 2017 (KR) .................. 10-2017-0033535

(51) Int. Cl.
| | |
|---|---|
| *G01R 31/327* | (2006.01) |
| *H02P 27/08* | (2006.01) |
| *H02M 1/08* | (2006.01) |
| *H02M 7/5387* | (2007.01) |
| *H02M 1/32* | (2007.01) |
| *G01R 31/42* | (2006.01) |

(Continued)

(52) U.S. Cl.
CPC ......... *G01R 31/3278* (2013.01); *G01R 31/42* (2013.01); *H02M 1/08* (2013.01); *H02M 1/32* (2013.01); *H02M 7/53871* (2013.01); *H02P 27/08* (2013.01); *H02M 7/5387* (2013.01); *H02M 7/797* (2013.01); *H02M 2001/0009* (2013.01)

(58) Field of Classification Search
None
See application file for complete search history.

(56) References Cited

U.S. PATENT DOCUMENTS 9,287,768 B2 * 3/2016 Guyomard ............ H02M 5/458
9,360,515 B2   6/2016 Hirono
(Continued)

FOREIGN PATENT DOCUMENTS

| JP | S59132251 U | 9/1984 |
| JP | S6331478 A | 2/1988 |
| JP | H0315770 A | 1/1991 |

(Continued)

OTHER PUBLICATIONS

European Search Report for related European Application No. 18160195.6; report dated Jun. 26, 2018; (13 pages).

(Continued)

*Primary Examiner* — Paresh Patel
(74) *Attorney, Agent, or Firm* — K&L Gates LLP

(57) ABSTRACT

A diagnosing device of a three phase inverter is provided, which includes a relay connected in series with a capacitor disposed on a DC link, an initial charging resistor connected in parallel to the relay, an inverter comprising a switching device for controlling a power supply to three phase output lines, a current sensor disposed on a connection line connecting between the DC link and the inverter to sense a current, and a control unit for driving the switching device and diagnosing at least one of opening and shorting of the switching device according to whether the current is sensed or not.

5 Claims, 10 Drawing Sheets

(51) Int. Cl.
*H02M 1/00* (2006.01)
*H02M 7/797* (2006.01)

(56) References Cited

U.S. PATENT DOCUMENTS

2009/0009920 A1 1/2009 Yamada
2014/0211524 A1 7/2014 Guyomard et al.

FOREIGN PATENT DOCUMENTS

| JP | 2004289882 A | 10/2004 |
| JP | 2004357437 A | 12/2004 |
| JP | 2008054398 A | 3/2008 |
| JP | 2013162719 A | 8/2013 |
| JP | 2015223050 A | 12/2015 |
| JP | 2016092977 A | 5/2016 |
| JP | 2016123216 A | 7/2016 |
| JP | 2016165199 A | 9/2016 |

OTHER PUBLICATIONS

Sanjay Pithadia et al; "Analysis of Power Supply Topologies for IGBT Gate Drivers in Industrial Drives", Jul. 31, 2015 (Jul. 31, 2015), XP055643199; (10 Pages).
European Office Action for related European Application No. 18160195.6; action dated Dec. 19, 2019; (9 pages).
Japanese Office Action for related Japanese Application No. 2018-043147; action dated Oct. 2, 2018; (5 pages).

\* cited by examiner

DIAGNOSING DEVICE OF THREE PHASE INVERTER

CROSS-REFERENCE TO RELATED APPLICATIONS

Pursuant to 35 U.S.C. § 119(a), this application claims the benefit of earlier filing date and right of priority to Korean Application No. 10-2017-0033535, filed on Mar. 17, 2017 in the Korean Intellectual Property Office, the disclosure of which is incorporated herein by reference in its entirety.

TECHNICAL FIELD

The present disclosure relates to a diagnosing device of a three phase inverter.

BACKGROUND ART

Typical faults of an inverter that controls power system such as motor include opening and shorting of a switching device such as insulated gate bipolar transistor (IGBT) that controls the output signal to the power system, and ground fault on three phase output lines.

If the switching device is open, the output signal is not transmitted to the load constituting the power system so that abnormal control or uncontrollable situation may occur.

If the switching device is shorted during operation of a product, a closed circuit is generated between the power supply terminal and the DC link capacitor in the inverted, resulting in very large currents. Such undesirable large currents may lead to burnout of capacitors, switching devices, and so on, which may lead to secondary accidents that may harm the user.

The ground fault on the three phase output line causes the path of the current to be divided in at least one of the phases of the output line, thus hindering equilibrium of the three phase currents. When this unbalance occurs, it is difficult to accurately determine the three phase voltage and current, not to mention the difficulty of performing control based on the three phase voltage and current.

Conventionally, when overcurrent is detected in order to prevent the risk resulting from opening or shorting of the switching device, the gating signal of the switching device is cut off and a trip is generated to stop the operation of the inverter. Conventionally, such operation is limited to protecting the inverter and accordingly, it is not possible to obtain accurate information on which part of the switching device or the output line has a fault.

SUMMARY

It is a technical object of the present disclosure to provide a diagnosing device of a three phase inverter, which ensures safety and is capable of diagnosing opening and shorting of a switching device and grounding fault of an output line.

According to an aspect of the present disclosure, there is provided a diagnosing device of a three phase inverter, which may include a relay connected in series with a capacitor disposed on a DC link, an initial charging resistor connected in parallel to the relay, an inverter including a switching device for controlling a power supply to three phase output lines, a current sensor disposed on a connection line connecting between the DC link and the inverter to sense a current, and a control unit for driving the switching device and diagnosing at least one of opening and shorting of the switching device according to whether the current is sensed or not.

In one embodiment of the present disclosure, prior to diagnosis, the control unit may cut off power applied to a power system being supplied with a three phase power from the inverter, and cut off non-diagnostic power that is for purposes other than diagnosis.

In one embodiment of the present disclosure, after cutting off the power supplied to the power system being supplied with three phase power from the inverter, while the power is supplied from the capacitor of the DC link, the control unit may diagnose at least one of opening and shorting of the switching device using the power of the capacitor.

In one embodiment of the present disclosure, the switching device may include upper switching devices disposed between output lines for each of the three phases and a first pole of the capacitor, respectively, and lower switching devices disposed between the output lines for each of the three phases and a second pole opposite to the first pole of the capacitor.

In one embodiment of the present disclosure, the control unit may selectively drive the switching devices so that the DC link, the output line for one of the three phases and the output line for another one of the phases form a closed circuit, to determine opening of the switching devices.

In one embodiment of the present disclosure, the control unit may independently drive the respective switching devices to diagnose shorting of the switching devices according to whether the current is sensed or not.

In one embodiment of the present disclosure, the control unit may drive one of the switching devices to determine whether the switching device connected to the same phase as the driven switching device driven is shorted or not according to whether a large current equal to or greater than a predetermined value is sensed or not.

Further, according to an aspect of the present disclosure, there is provided a diagnosing device of a three phase inverter, which may include a relay connected in series with a capacitor disposed on a DC link, an initial charging resistor connected in parallel to the relay, an inverter including a switching device for controlling a power supply to three phase output lines, a first current sensor disposed on one pole of connection lines connecting between the DC link and the inverter to sense a first current, a second current sensor disposed on another connection line of the connection lines connecting between the DC link and the inverter to sense a second current, in which the another connection line is different from the connection line on which the first current sensor is disposed, and a control unit for driving the switching device and diagnosing a ground fault of the three phase output lines according to whether the first current or the second current is in equilibrium or not.

In one embodiment of the present disclosure, the switching device may include upper switching devices disposed between output lines for each of the three phases and a first pole of the capacitor, respectively, and lower switching devices disposed between the output lines for each of the three phases and a second pole opposite to the first pole of the capacitor.

In one embodiment of the present disclosure, the control unit may selectively drive the switching devices so that the DC link, the output line for one of the three phases and the output lines for the other two of the phases form a closed circuit, and determine whether the one of the three phases has a ground fault or not according to whether the first current and the second current are in equilibrium or not.

The present disclosure gives the following effects. The present disclosure has the effect of diagnosing opening and shorting of a switching device and grounding fault of an output line, after cutting off power output.

The present disclosure has an effect of preventing an overcurrent that may occur during the diagnosis described above.

The present disclosure has the effect of storing a result of the diagnosis and generating a trip in the event of a fault, thereby preventing accident in advance.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION

Figure 1:
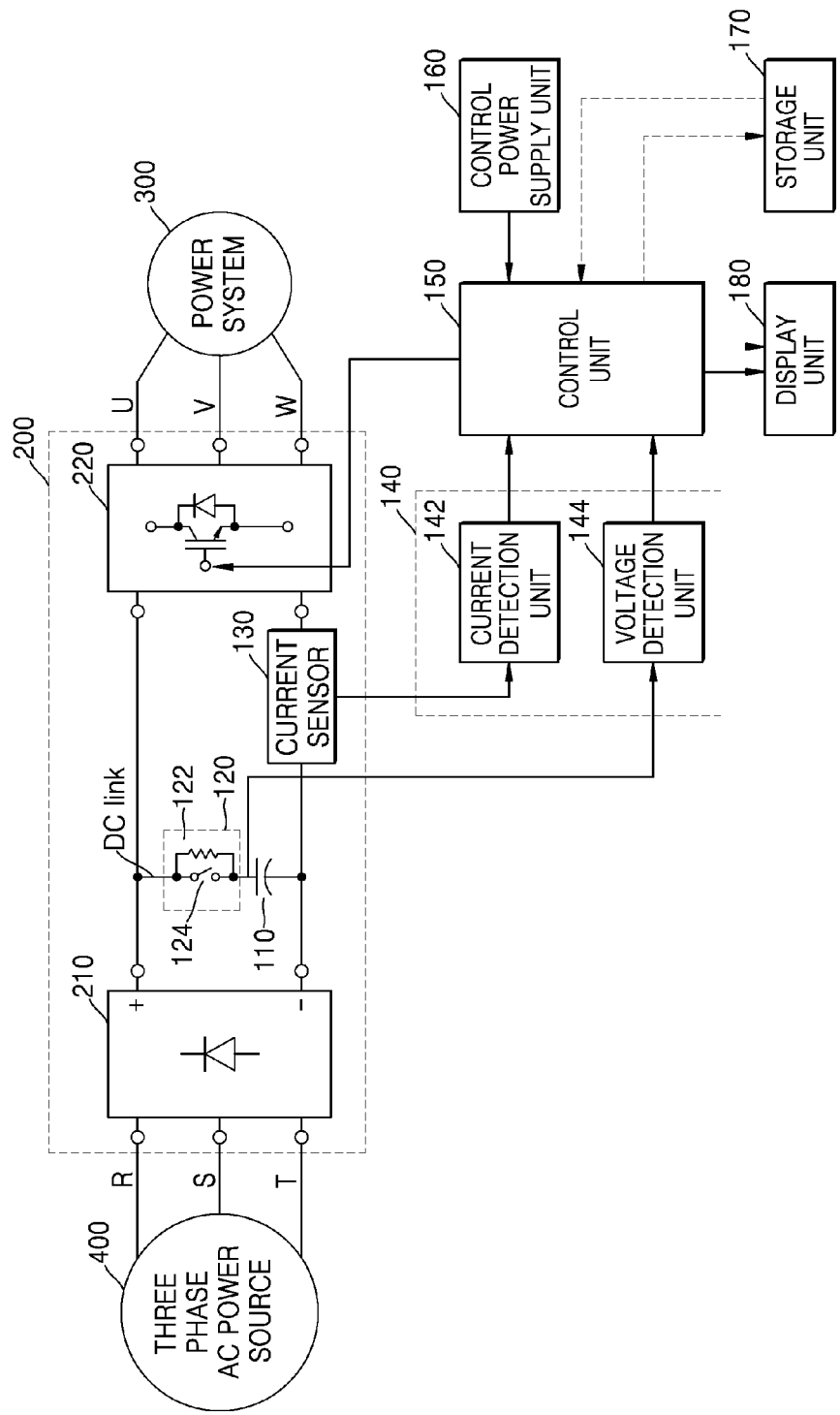
FIG. 1 is a view illustrating a diagnosing device of a three phase inverter according to an embodiment of the present disclosure.

Various modifications may be made to exemplary embodiments of the present disclosure, and certain exemplary embodiments will be described below in detail with reference to attached drawings. It should be understood, however, that the disclosure is not to be limited to the specific embodiments, but includes all modifications, equivalents, and alternatives falling within the spirit and scope of the disclosure.

Hereinafter, embodiments of the present disclosure will be described in detail with reference to the accompanying drawings.

A control unit 200 of a power system 300 may include a converter 210 for rectifying three phase AC power source 400 (R-phase, S-phase, and T-phase), a DC link capacitor for smoothing the rectified power source, and an inverter 220.

The inverter 220 may convert the smoothed DC power source into three phase AC power source and provide it to the power system 300.

The present disclosure relates to a diagnosing device of a three phase inverter for diagnosing a ground fault with respect to a switching device of the three phase inverter 220 or output lines of three phase (U phase, V phase and W phase) outputted to the power system 300.

FIG. 1 is a view illustrating a diagnosing device of a three phase inverter according to an embodiment of the present disclosure.

Referring to FIG. 1, a diagnosing device of a three phase inverter according to an embodiment of the present disclosure includes a capacitor 110, an initial charging unit 120, an initial charging resistor 122, a relay 124, a current sensor 130, a detection unit 140, a control unit 150, a control power supply unit 160, a storage unit 170, and a display unit 180.

The capacitor 110 is disposed on a DC link, in which both ends of the DC link are respectively connected to the lines that connect the converter 210 for rectifying the three phase AC power source 400 to the inverter 220. The capacitor 110 may smooth the rectified power.

The initial charging unit 120 is connected in series with the capacitor 110 disposed on the DC link and includes the initial charging resistor 122 and the relay 124.

The initial charging resistor 122 is connected in series with the capacitor 110 and the relay 124 may be connected in parallel with the initial charging resistor 122.

During the initial operation of the inverter, the relay 124 may be controlled to an open state, in which case the rectified voltage may be applied to the initial charging resistor 122, thereby suppressing the large current.

After the capacitor 110 is charged for a certain amount of time, when the voltage detection unit 144 detects a DC voltage of a predetermined magnitude or higher in the capacitor 110, the control unit 150 closes the relay 124 and allows the inverter 220 to operate the power system 300. Through the operation described above, the initial charging unit 120 may suppress an inrush current that may occur in the initial stage.

The initial charging unit 120 may not only suppress the inrush current that may occur in the initial stage, but also suppress the overcurrent during diagnosing operation.

For example, during diagnosing operation, a closed circuit may be generated without a load between the DC link and the inverter 220, and in this case, the overcurrent may likewise be suppressed since the initial charging unit 120 is disposed on the DC link.

The current sensor 130 may be disposed on a connection line that connects one pole of the DC link to the inverter 220, to sense the current flowing through the DC link and the inverter 220. Although the current sensor 130 is illustrated as being connected to the lower connection line in FIG. 1, embodiment is not limited thereto and accordingly, the current sensor 130 may be connected to the upper connection line.

The detection unit 140 may detect the current sensed by the current sensor 130 and the voltage sensed by the voltage sensor (not shown), to thus provide the control unit 150 with the current and voltage information.

The current detection unit 142 may provide the control unit 150 with the sensed current information.

The voltage detection unit 144 may provide the control unit 150 with the sensed voltage information.

The control unit 150 may control the switching devices of the inverter 220 and diagnose a fault of the inverter through the sensed current.

The control unit 150 may control the relay 124 or stop diagnosing based on the sensed voltage. For example, during initial operation of the inverter, the control unit 150 closes the relay 124 when determining that voltage is equal to or greater than a predetermined value. For example, the control unit 150 may stop diagnosing when the voltage falls below the predetermined value during diagnosis.

The control power supply unit 160 supplies power to the control unit 150. The control unit 150 may control the switching devices using the power supplied from the control power supply unit 160.

The storage unit 170 may store a predetermined value for voltage, a predetermined value for large current to be described later, a parameter for diagnosis, a pulse width modulation (PWM) signal pattern used for controlling switching devices, and so on.

The display unit 180 may visually display the information on the result of diagnosis. For example, the control unit 150 may store the result of diagnosis in the storage unit 170 and display it on the display unit 180.

Figure 2:
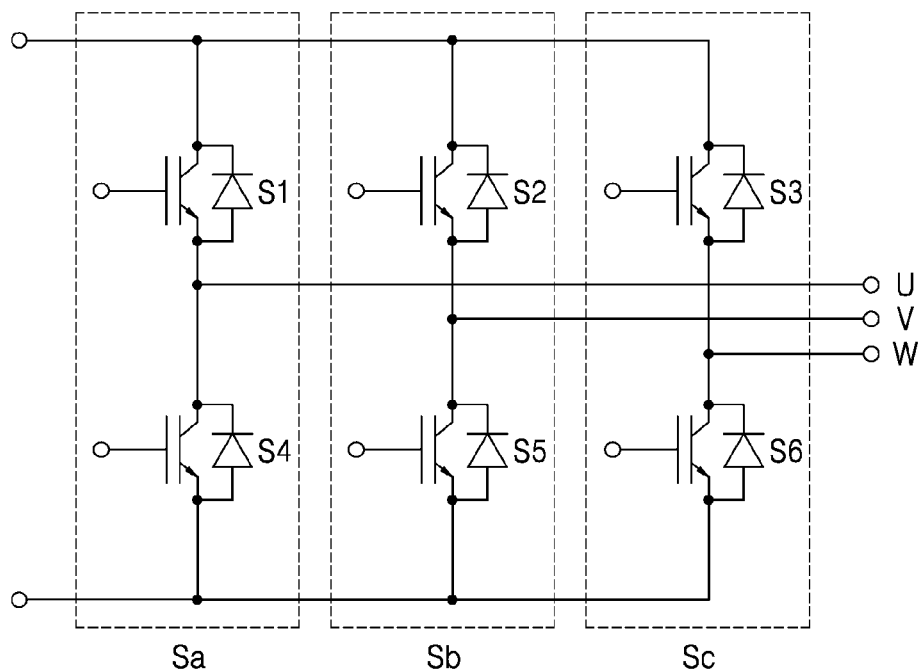
FIG. 2 is a view illustrating a connecting state between switching devices in an inverter of a diagnosing device of a three phase inverter according to an embodiment of the present disclosure.

FIG. 2 is a view illustrating a connecting state between the switching devices in an inverter 220 of a diagnosing device of a three phase inverter according to an embodiment of the present disclosure.

Referring to FIG. 2, the switching devices in the inverter 220 of the diagnosing device of a three phase inverter according to an embodiment of the present disclosure may include upper switching devices S1, S2, S3 disposed between the output lines for each of the three phases (U, V, W) and the first pole of the capacitor 110, respectively, and lower switching devices S4, S5, S6 disposed between output lines for each of three phases (U, V, W) and the second pole opposite to the first pole of the capacitor 110, respectively.

According to embodiments of the present disclosure, the switching devices arranged in the same column are connected to the same phase output lines. Further, the upper and lower switching devices Sa are for the U phase, the upper and lower switching devices Sb are for the V phase, and the upper and lower switching devices Sc are for the W phase.

The switching devices may control the power supply to the three phase output lines. In an example, two switching devices in the same column should not be driven. That is, the switching devices disposed in Sa, Sb and Sc are driven so that they are not closed at the same time. For example, if S1 and S4 in Sa are simultaneously closed or shorted, the capacitor 110 and S1 and S4 may form a closed circuit and a very large current may flow.

Meanwhile, in the present disclosure, the initial charging unit 120 is provided as described above in consideration of the situation where one or more of the switching devices are shorted.

Figure 3:
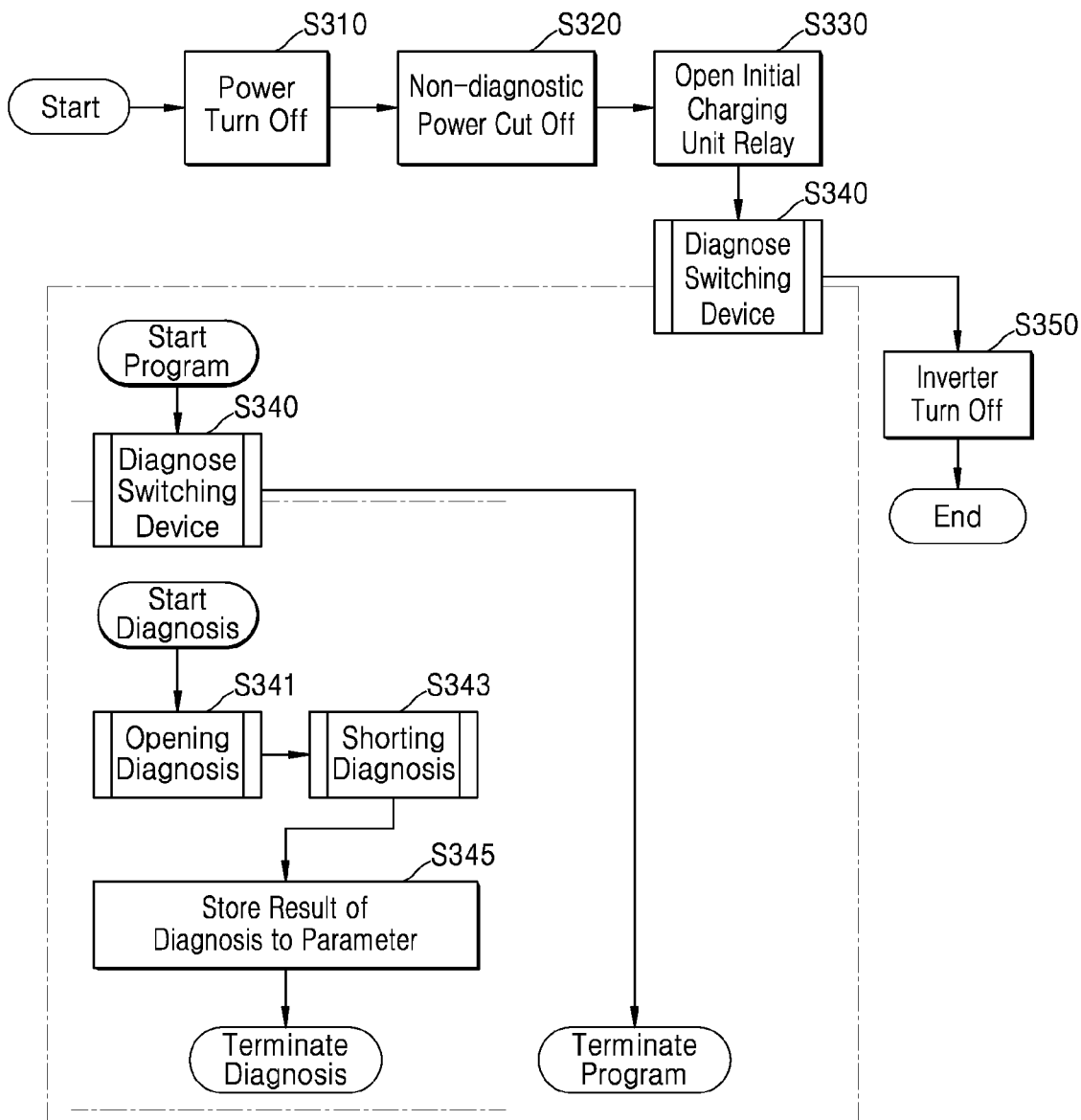
FIG. 3 is a view illustrating a method of diagnosing opening and shorting of a switching device according to an embodiment of the present disclosure.

FIG. 3 is a view illustrating a method of diagnosing opening and shorting of a switching device according to an embodiment of the present disclosure.

The methods of diagnosing illustrated in FIGS. 3 to 6 may be performed by a diagnosing device of a three phase inverter according to an embodiment of the present disclosure. Therefore, in the present specification, the diagnosing methods in FIGS. 3 to 6 will be described mainly with reference to the components of the diagnosing device of a three phase inverter.

Referring to FIG. 3, at S310, the control unit 150 may cut off the power applied to the power system 300.

At S320, the control unit 150 may cut off the non-diagnostic power that is used for purposes other than diagnosis. The power used for the purposes other than diagnosis may be, for example, a driving power for a fan and so on.

At S330, the control unit 150 may open the relay 124. Opening the relay 124 allows the current to flow through the initial charging resistor 122 to suppress an overcurrent that may flow when the switching devices Sa, Sb, or Sc are shorted.

At S340, the control unit 150 may diagnose the switching device. The control unit 150 may selectively drive the switching device to diagnose the state of the switching device according to whether the current is sensed or not, or whether the current is equal to or greater than a predetermined value.

The control unit 150 may diagnose the switching devices within a time period in which the power is cut off and the capacitor 110 is discharged such that the voltage sensed at the voltage detection unit 144 becomes equal to or less than the predetermined value. The control unit 150 may drive the switching devices with short pulses when diagnosing the switching devices.

At S350, after completing the diagnosis, the control unit 150 may cut off all the power provided to the inverter.

At S341, the control unit 150 may diagnose whether or not the switching device is open, and at S343, the control unit 150 may diagnose to determine whether the switching device is shorted or not. The method of diagnosing opening and shorting will be described in detail with reference to FIGS. 4 to 6.

At S345, the control unit 150 may store the result of diagnosis in the storage unit 170 as a switching device parameter.

Figure 4:
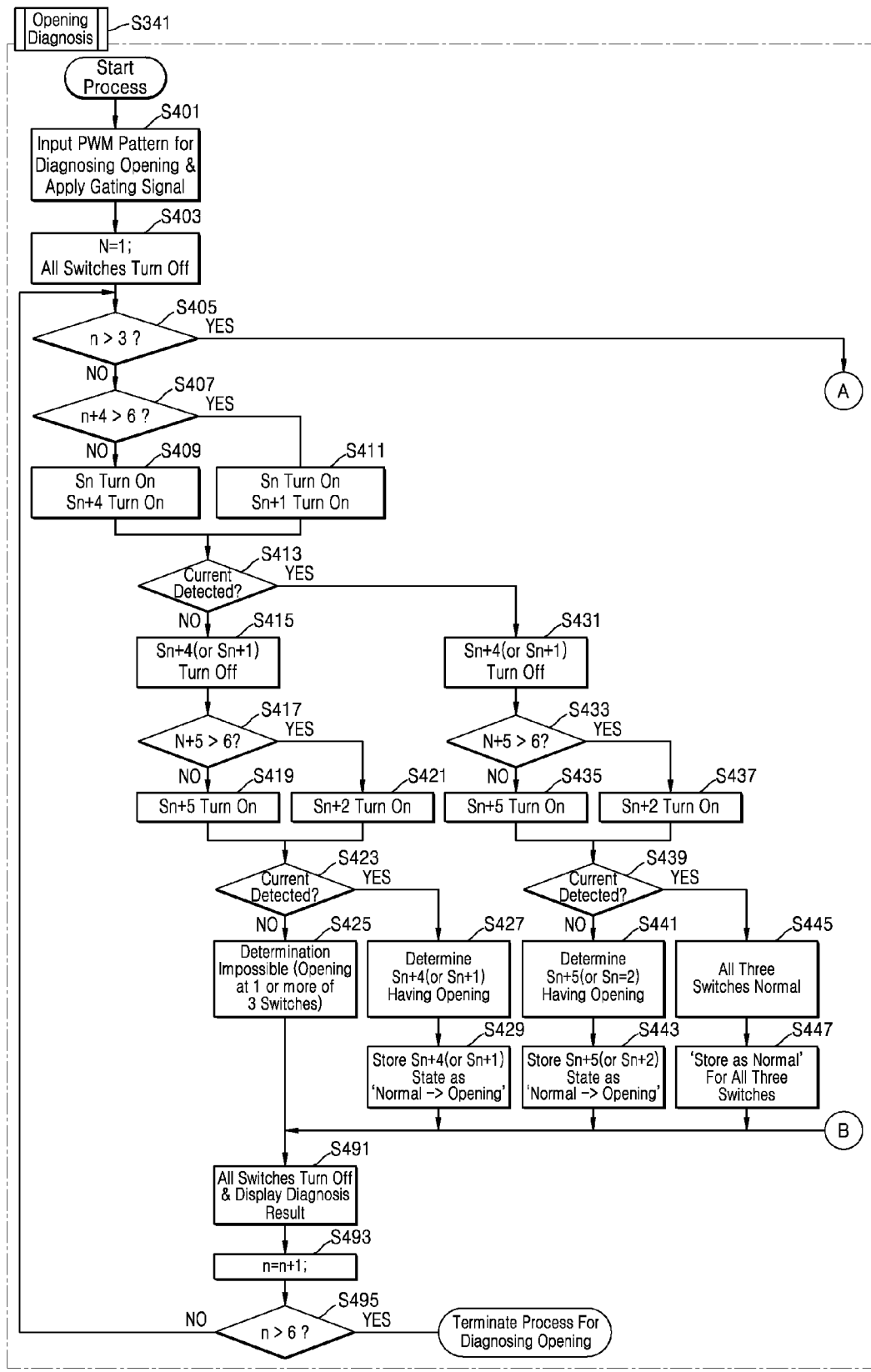
FIG. 4 is a detailed view illustrating a method of diagnosing opening of a switching device according to an embodiment of the present disclosure.
Figure 5:
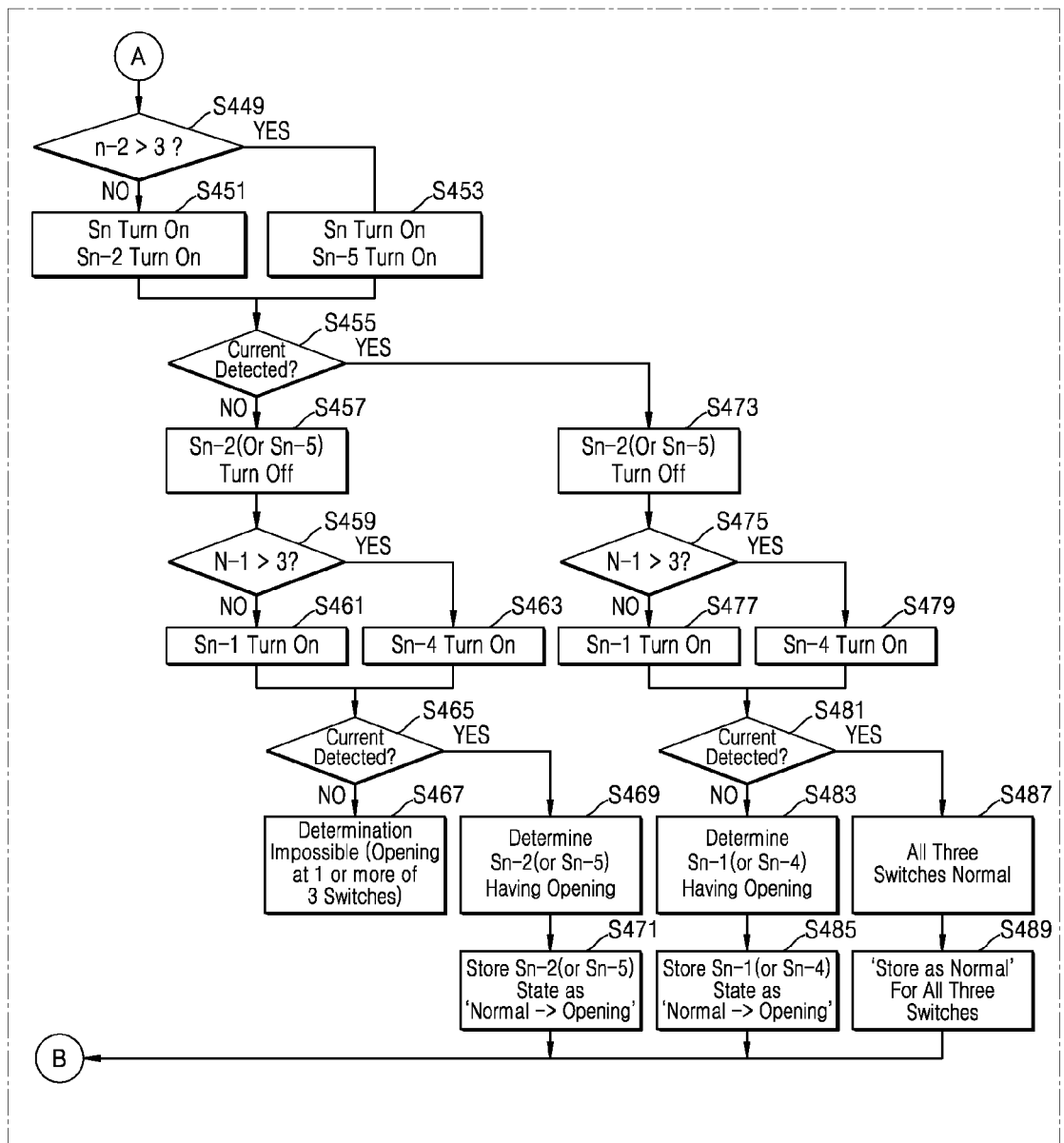
FIG. 5 is a detailed view illustrating a method of diagnosing opening of a switching device according to an embodiment of the present disclosure.

FIGS. 4 and 5 are detailed views illustrating a method of diagnosing opening of a switching device according to an embodiment of the present disclosure.

Referring to FIG. 4, at S401, the control unit 150 may input a PWM pattern for opening diagnosis to apply a gating signal to the switching devices. The gating signal for the switching devices by the PWM pattern may be provided in operations at S405 to S495, and the operation at S401 may correspond to a start.

[Table 1] below shows the PWM signal pattern applied to the switching device.

TABLE 1

|    | S1 ON |   |   | S2 ON |   |   | S3 ON |   |   | S4 ON |   |   | S5 ON |   |   | S6 ON |   |   |
|----|---|---|---|---|---|---|---|---|---|---|---|---|---|---|---|---|---|---|
| Sa | — | 1 | 1 | — | 0 | — | — | 0 | — | — | 0 | 0 | — | 1 | — | — | 1 | — |
| Sb | — | 1 | — | — | 1 | 1 | — | — | 0 | — | 1 | — | — | 0 | 0 | — | — | 1 |
| Sc | — | — | 0 | — | — | 0 | — | 1 | 1 | — | — | 1 | — | — | 1 | — | 0 | 0 |

In Table 1, '1' denotes that the upper switching device is on and the lower switching device is off, '0' denotes that the upper switching device is off and the lower switching device is on, and '–' denotes that both the upper and lower switching devices are off.

The control unit 150 may sequentially drive the switching devices, starting from S1, according to the pattern of [Table 1].

At S403, the control unit 150 may set the natural number n (n=1, 2, 3, 4, 5, 6) corresponding to each of the switching devices to 1.

At S405, the control unit 150 determines whether or not n is greater than 3. When n is not greater than 3, the process proceeds to operation of S407; otherwise, i.e., when n is greater than 3, the process proceeds to operation of S449 of FIG. 5.

At S407, the control unit 150 determines whether or not (n+4) is greater than 6. When (n+4) is not greater than 6, the process proceeds to operation of S409, and when (n+4) is greater than 6, the process proceeds to operation of S411.

At S409, the control unit 150 may drive the switching device Sn and the switching device Sn+4. For example, the control unit 150 may drive the switching device S1 and the switching device S5 when n=1.

At S411, the control unit 150 may drive the switching device Sn and the switching device Sn+1. For example, the control unit 150 may drive the switching device S2 and the switching device S3 when n=2.

At S413, the control unit 150 determines whether or not current is detected. For example, when n=1, the control unit 150 may determine whether current is detected or not while the switching device S1 and the switching device S5 are driven. When the current is not detected, the process proceeds to operation of S415, and when the current is detected, the process proceeds to operation of S431.

At S415, the control unit 150 turns off the switching device Sn+4 or the switching device Sn+1. The control unit 150 may turn off the switching device Sn+4 when it is after S409, and turn off the switching device Sn+1 when it is after S411. For example, when n=1, the control unit 150 may turn off the switching device S5. At S431, the control unit 150 may also perform the same method.

At S417, the control unit 150 determines whether or not (n+5) is greater than 6. When (n+5) is not greater than 6, the process proceeds to operation of S419, and when (n+5) is greater than 6, the process proceeds to operation of S421. At S433, the control unit 150 may also perform the same method.

At S419, the control unit 150 may drive the switching device Sn+5. For example, when n=1, the control unit 150 may drive the switching device S6. At S435, the control unit 150 may also perform the same method.

At S421, the control unit 150 may drive the switching device Sn+2. For example, when n=2, the control unit 150 may drive the switching device S4. At S437, the control unit 150 may also perform the same method.

At S423, the control unit 150 may determine whether current is detected. For example, when n=1, the control unit 150 may determine whether current is detected or not while the switching device S1 and the switching device S6 are driven. When the current is not detected, the process proceeds to operation of S425, and when the current is detected, the process proceeds to operation of S427. At S439, the control unit 150 may also perform the same method.

At S425, the control unit 150 may store the result of diagnosis that indicates that one or more of the three selectively driven switching devices are open. For example, when n=1, if no current is detected while the switching device S1 and the switching device S5 are driven, and no current is detected while the switching device S1 and the switching device S6 are driven, this indicates that at least one of the three switching devices S1, S5, and S6 is open.

At S427, the control unit 150 may determine that the switching device Sn+4 or the switching device Sn+1 is in the open state. For example, when n=1, if no current is detected while the switching device S1 and the switching device S5 are driven, but the current is detected while the switching device S1 and the switching device S6 are driven, it is determined that the switching device S5 is open.

At S429, the control unit 150 may store the state of the switching device Sn+4 or switching device Sn+1 as an open state.

At S441, the control unit 150 may determine that the switching device Sn+5 or the switching device Sn+2 is in an open state.

At S443, the control unit 150 may store the state of the switching device Sn+5 or switching device Sn+2 as an open state.

At S445, the control unit 150 may determine that all three selectively driven switching devices are normal.

At S447, the control unit 150 may store all the parameters for the three switching devices as a normal state.

Referring to FIG. 5, at S449, the control unit 150 determines whether (n−2) is greater than 3. When (n−2) is not greater than 3, the process proceeds to operation of S451, and when (n−2) is greater than 3, the process proceeds to operation of S453.

At S451, the control unit 150 may drive the switching device Sn and the switching device Sn−2. For example, the control unit 150 may drive the switching device S4 and the switching device S2 when n=4.

At S453, the control unit 150 may drive the switching device Sn and the switching device Sn−5. For example, the control unit 150 may drive the switching device S6 and the switching device S1 when n=6.

At S455, the control unit 150 determines whether or not current is detected. For example, when n=4, the control unit 150 determines whether current is detected while the switching device S4 and the switching device S2 are driven. When the current is not detected, the process proceeds to operation of S457, and when the current is detected, the process proceeds to operation of S459.

At S457, the control unit 150 turns off the switching device Sn−2 or the switching device Sn−5. The control unit 150 may turn off the switching device Sn−2 when it is after S451, and may turn off the switching device Sn−5 when it is after S453. For example, when n=4, the control unit 150 may turn off the switching device S2. At S473, the control unit 150 may also perform the same method.

At S459, the control unit 150 determines whether (n−1) is greater than 3. When (n−1) is not greater than 3, the process proceeds to operation of S461, and when (n−1) is greater than 3, the process proceeds to operation of S463. At S475, the control unit 150 may also perform the same method.

At S461, the control unit 150 may drive the switching device Sn−1. For example, when n=4, the control unit 150 may drive the switching device S3. At S477, the control unit 150 may also perform the same method.

At S463, the control unit 150 may drive the switching device Sn−4. For example, when n=6, the control unit 150 may drive the switching device S2. At S479, the control unit 150 may also perform the same method.

At S465, the control unit 150 may determine whether current is detected. For example, when n=4, the control unit 150 determines whether current is detected while the switching device S4 and the switching device S3 are driven. When the current is not detected, the process proceeds to operation of S467, and when the current is detected, the process proceeds to operation of S469. At S481, the control unit 150 may also perform the same method.

At S467, the control unit 150 may store the result of diagnosis that indicates that one or more of the three selectively driven switching devices are open. For example, when n=4, if no current is detected while the switching device S4 and the switching device S2 are driven, and no current is detected while the switching device S4 and the switching device S3 are driven, this indicates that at least one of the three switching devices S4, S2, and S3 is open.

At S469, the control unit 150 may determine that the switching device Sn−2 or the switching device Sn−5 is in an open state. For example, when n=4, if no current is detected while the switching device S4 and the switching device S2 are driven, but the current is detected while the switching device S4 and the switching device S3 are driven, it is determined that the switching device S2 is open.

At S471, the control unit 150 may store the state of the switching device Sn−2 or switching device Sn−5 as an open state.

At S483, the control unit 150 may determine that the switching device Sn−1 or the switching device Sn−4 is in an open state.

At S485, the control unit 150 may store the state of the switching device Sn−1 or switching device Sn−4 as an open state.

At S487, the control unit 150 may determine that all three selectively driven switching devices are normal.

At S489, the control unit 150 may store all the parameters for the three switching devices as a normal state.

At S491, the control unit 150 may turn off all the switching devices and display the result of diagnosis on the display unit 180.

At S493, the control unit 150 may update the value of n to n+1.

At S495, the control unit 150 determines whether or not n is greater than 6. When n is not greater than 6, the process returns to operation of S405, and when n is greater than 6, the diagnosis for opening may be terminated.

As described above with reference to FIGS. 4 and 5, the control unit 150 may selectively drive the switching devices so that the DC link, the output line for one of the three phases and the output line for another one of the phases may form a closed circuit to determine whether the device is open or not.

For example, the control unit 150 may selectively drive two switching devices S1 and S5 so that a closed circuit is formed by the positive pole of the DC link, the output line for the U phase, the output line for the V phase, and the negative pole of the DC link.

For example, the control unit 150 may selectively drive two switching devices S1 and S6 so that a closed circuit is formed by the positive pole of the DC link, the output line for the U phase, the output line for the W phase, and the negative pole of the DC link.

After diagnosing opening state, the method of determining opening of the switching device may be performed according to [Table 2] below.

TABLE 2

| | S1 ON | S2 ON | S3 ON | S4 ON | S5 ON | S6 ON | Determination |
|---|---|---|---|---|---|---|---|
| S1 ON | | | | | ○ | ○ | No opening at S1, S5, S6 |
| | | | | | ○ | X | Opening at S6 |
| | | | | | X | ○ | Opening at S5 |
| | | | | | X | X | Opening at 1 or more of S1, S5, S6 |
| S2 ON | | | | ○ | | ○ | No opening at S2, S4, S6 |
| | | | | ○ | | X | Opening at S6 |
| | | | | X | | ○ | Opening at S4 |
| | | | | X | | X | Opening at 1 or more of S2, S4, S6 |
| S3 ON | | | | ○ | ○ | | No opening at S3, S4, S5 |
| | | | | ○ | X | | Opening at S5 |
| | | | | X | ○ | | Opening at S4 |
| | | | | X | X | | Opening at 1 or more of S3, S4, S5 |
| S4 ON | | | ○ | | ○ | | No opening at S2, S3, S4 |
| | | | ○ | | X | | Opening at S3 |
| | | | X | | ○ | | Opening at S2 |
| | | | X | | X | | Opening at 1 or more of S2, S3, S4 |
| S5 ON | ○ | | ○ | | | | No opening at S1, S3, S5 |
| | ○ | | X | | | | Opening at S3 |
| | X | | ○ | | | | Opening at S1 |
| | X | | X | | | | Opening at 1 or more of S1, S3, S5 |
| S6 ON | ○ | ○ | | | | | No opening at S1, S2, S6 |
| | ○ | X | | | | | Opening at S2 |
| | X | ○ | | | | | Opening at S1 |
| | X | X | | | | | Opening at 1 or more of S1, S2, S6 |

In Table 2, O denotes that current is detected, and X denotes that no current is detected.

Figure 6:
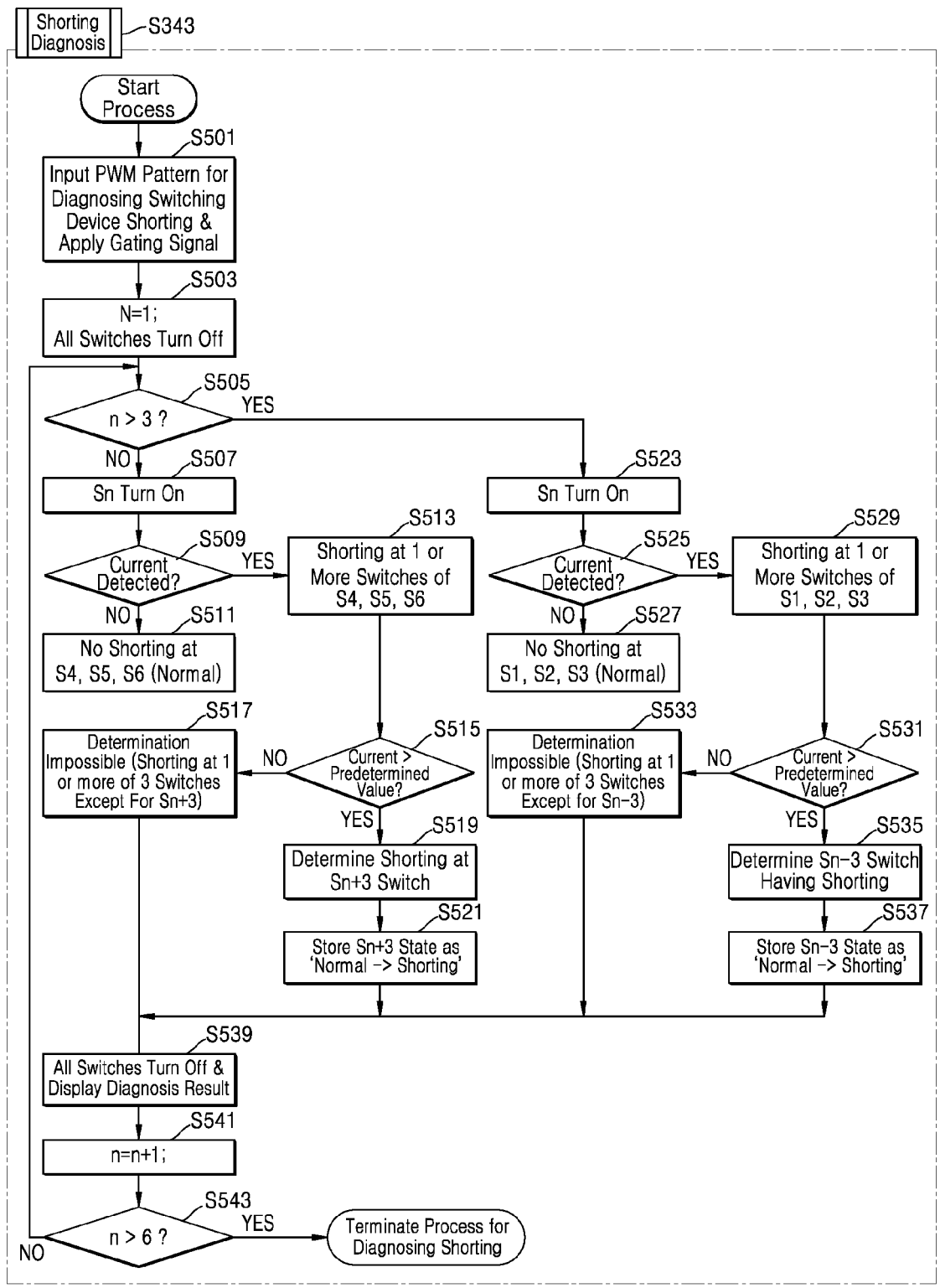
FIG. 6 is a detailed view illustrating a method of diagnosing shorting of a switching device according to an embodiment of the present disclosure.

FIG. 6 is a detailed view illustrating a method of diagnosing shorting of a switching device according to an embodiment of the present disclosure.

Referring to FIG. 6, at S501, the control unit 150 may input a PWM pattern for shorting diagnosis and apply a gating signal to the switching device. The gating signal to the switching device by the PWM pattern may be provided at S503 to S543, and operation at S501 may correspond to a start.

[Table 3] below shows the PWM signal pattern applied to the switching device.

TABLE 3

|  | S1 ON | S2 ON | S3 ON | S4 ON | S5 ON | S6 ON |
|---|---|---|---|---|---|---|
| Sa | — | 1 | — | 0 | — | — |
| Sb | — | — | 1 | — | 0 | — |
| Sc | — | — | — | 1 | — | 0 |

In Table 3, '1' denotes that the upper switching device is on and the lower switching device is off, '0' denotes that the upper switching device is off and the lower switching device is on, and '-' denotes that both the upper and lower switching devices are off.

At S503, the control unit 150 may set the natural number n (n=1, 2, 3, 4, 5, 6) corresponding to each of the switching devices to 1. At S505, the control unit 150 does not drive any of the switching devices.

At S505, the control unit 150 determines whether or not n is greater than 3. When n is not greater than 3, the process proceeds to operation of S507; otherwise, i.e., when n is greater than 3, the process proceeds to operation of S523.

At S507, the control unit 150 may drive the switching device Sn. For example, when n=1, the control unit 150 may drive the switching device S1.

At S509, the control unit 150 may determine whether current is detected. When the current is not detected, the process proceeds to operation of S511, and when the current is detected, the process proceeds to operation of S513.

At S511, the control unit 150 may determine that the three lower switching devices S4, S5, and S6, which may construct a closed circuit with the upper switching devices S1, S2, or S3, are all normal.

At S513, the control unit 150 may determine that at least one of the three switching devices S4, S5, and S6 is shorted.

At S515, the control unit 150 may determine whether the detected current is equal to or greater than a predetermined value. This is performed because, when the lower switching device arranged in the same column as the driven upper switching device is shorted, because a closed circuit is formed with the DC link while excluding the loads of the power system 300, larger current flows as compared to when other switching devices are shorted. When the detected current is not greater than a predetermined value, the process proceeds to operation of S517, and when the detected current is greater than the predetermined value, the process proceeds to operation of S519.

At S517, the control unit 150 may determine that at least one of the three switching devices S4, S5, and S6 are shorted, except for the switching device arranged in the same column as the driven upper switching device.

At S519, the control unit 150 may determine that a switching device Sn+3 arranged in the same column as the driven upper switching device Sn is shorted.

At S521, the control unit 150 may store the state of the switching device Sn+3 as the shorted state.

At S523, the control unit 150 may drive the switching device Sn. For example, when n=4, the control unit 150 may drive the switching device S4.

At S525, the control unit 150 may determine whether current is detected. When the current is not detected, the process proceeds to operation of S527, and when the current is detected, the process proceeds to operation of S529.

At S527, the control unit 150 may determine that the three upper switching devices S1, S2, and S3, which may form a closed circuit with the lower switching devices S4, S5, or S6, are all normal.

At S529, the control unit 150 may determine that at least one of the three switching devices S1, S2, and S3 is shorted.

At S531, the control unit 150 may determine whether the detected current is equal to or greater than a predetermined value. This is performed because, when the upper switching device arranged in the same column as the driven lower switching device is shorted, because a closed circuit is formed with the DC link while excluding the loads of the power system 300, larger current flows as compared to when other switching devices are shorted. When the detected current is not greater than a predetermined value, the process proceeds to operation of S533, and when the detected current is greater than the predetermined value, the process proceeds to operation of S535.

At S533, the control unit 150 may determine that at least one of the three switching devices S1, S2, and S3 are shorted, except for the switching device arranged in the same column as the driven lower switching device.

At S535, the control unit 150 may determine that a switching device Sn−3 arranged in the same column as the driven lower switching device Sn is shorted.

At S537, the control unit 150 may store the state of the switching device Sn−3 as the shorted state.

At S539, the control unit 150 may turn off all the switching devices and display the result of diagnosis on the display unit 180.

At S541, the control unit 150 may update the value of n to n+1.

At S543, the control unit 150 determines whether or not n is greater than 6. When n is not greater than 6, the process returns to operation of S505, and when n is greater than 6, the diagnosis for short circuit may be terminated.

As described above with reference to FIG. 6, the control unit 150 may initially determine whether the switching device is shorted or not by independently driving each of the six switching devices S1 to S6 and detecting presence or absence of current. The control unit 150 may secondarily determine that the switching device connected to the same phase (or arranged in the same column) is shorted, when the current is detected and when the magnitude of the detected current is equal to or greater than a predetermined value (hereinafter, referred to as a 'large current').

After diagnosing opening state, the method of determining opening of the switching device may be performed according to [Table 4] below.

TABLE 4

| | Detected current | Primary determination | Detected large current | Secondary determination |
|---|---|---|---|---|
| S1 ON | O | Short at one or more of S4, S5, S6 | O | Shorting at S4 |
| | | | X | — |
| | X | No short at S1, S4, S5, S6 | — | — |
| S2 ON | O | Short at one or more of S4, S5, S6 | O | Shorting at S5 |
| | | | X | — |
| | X | No short at S2, S4, S5, S6 | — | — |
| S3 ON | O | Short at one or more of S4, S5, S6 | O | Shorting at S6 |
| | | | X | — |
| | X | No short at S3, S4, S5, S6 | — | — |
| S4 ON | O | Short at one or more of S1, S2, S3 | O | Shorting at S1 |
| | | | X | — |
| | X | No short at S1, S2, S3, S4 | — | — |
| S5 ON | O | Short at one or more of S1, S2, S3 | O | Shorting at S2 |
| | | | X | — |
| | X | No short at S1, S2, S3, S5 | — | — |
| S6 ON | O | Short at one or more of S1, S2, S3 | O | Shorting at S3 |
| | | | X | — |
| | X | No short at S1, S2, S3, S6 | — | — |

In Table 4, O denotes that current is detected, and X denotes that no current is detected.

Figure 7:
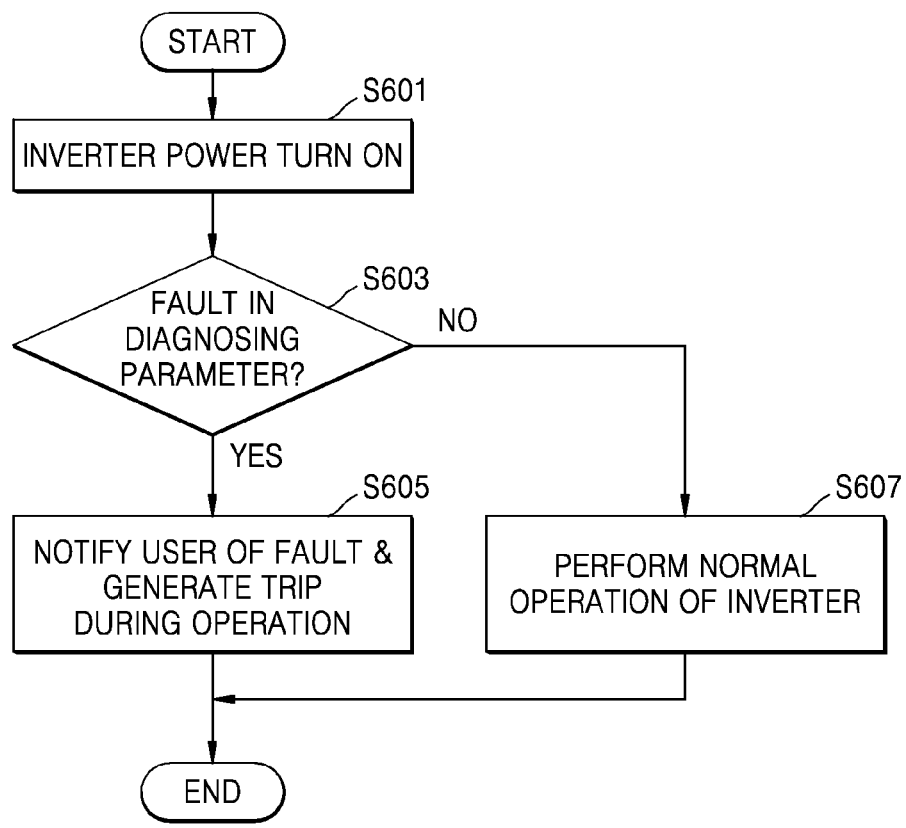
FIG. 7 is a flowchart illustrating a part of the operation of the diagnosing device of a three phase inverter according to an embodiment of the present disclosure.

FIG. 7 is a flowchart illustrating a part of the operation of the diagnosing device of a three phase inverter according to an embodiment of the present disclosure.

Referring to FIG. 7, at S601, the control unit 150 may apply power to the inverter.

At S603, the control unit 150 may read a diagnostic parameter stored in the storage unit 170 to determine whether a fault state is present or not. When there is a fault state, the process proceeds to operation of S605, and when there is no fault state, the process proceeds to operation of S607.

At S605, the control unit 150 may display fault information on the display unit 180 and generate a trip.

At S607, the control unit 150 may normally operate the inverter.

Figure 8:
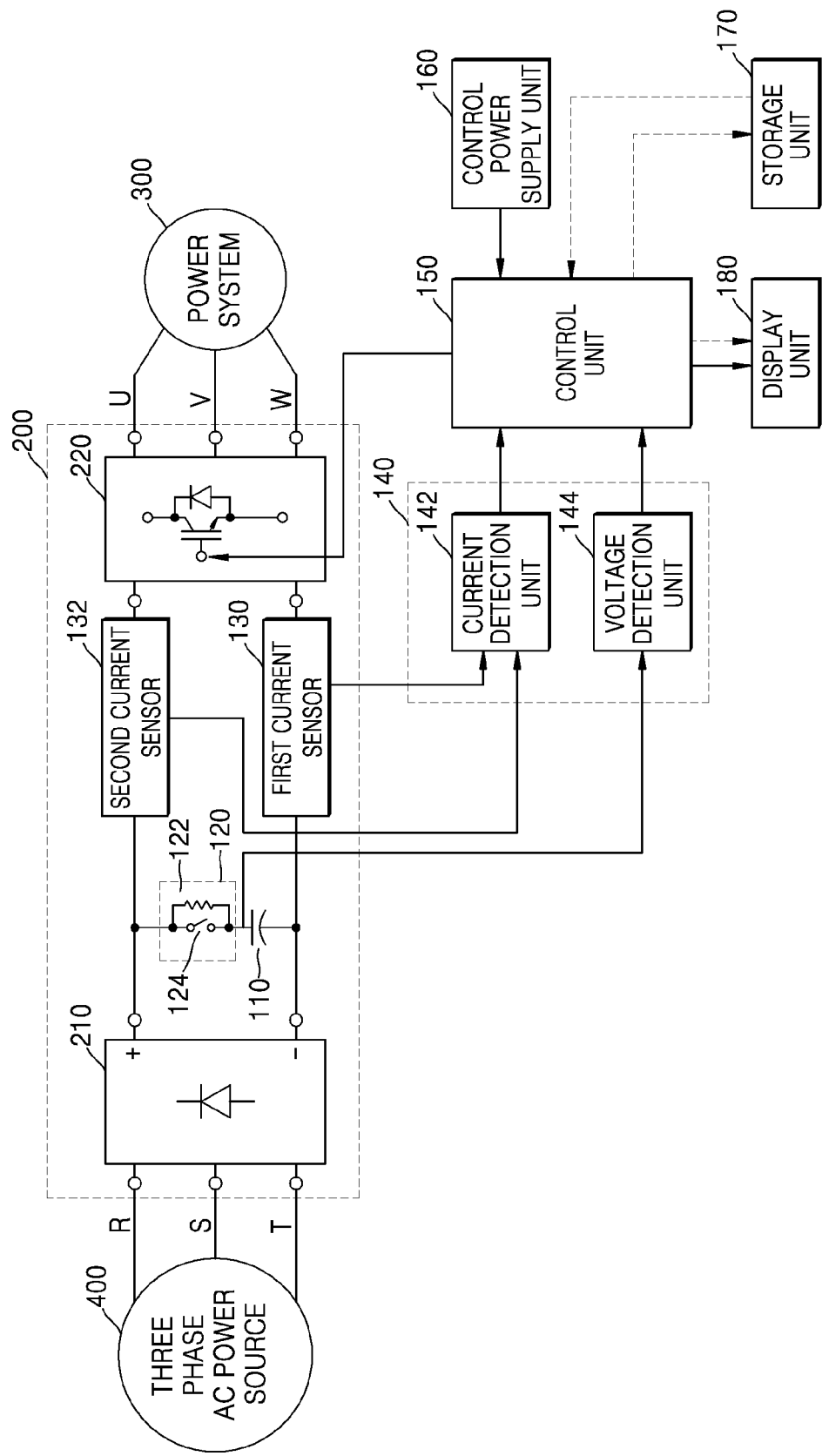
FIG. 8 is a view illustrating a diagnosing device of a three phase inverter according to an embodiment of the present disclosure.

FIG. 8 is a view illustrating a diagnosing device of a three phase inverter according to an embodiment of the present disclosure.

Referring to FIG. 8, a diagnosing device of a three phase inverter according to an embodiment of the present disclosure includes a capacitor 110, an initial charging unit 120, an initial charging resistor 122, a relay 124, a first current sensor 130, a second current sensor 132, a detection unit 140, a control unit 150, a control power supply unit 160, a storage unit 170, and a display unit 180.

In FIG. 8, since the configurations other than the first current sensor 130 and the second current sensor 132 are the same as those described above with reference to FIG. 1, detailed description thereof will be omitted for the sake of brevity.

The first current sensor 130 may be disposed on one of the poles of the connection lines between the DC link and inverter 220 to sense a current flowing from that pole to the inverter 220.

The second current sensor 132 may be disposed on the other pole of the connection lines between the DC link and the inverter 220 that is different from the first current sensor 130 to detect the current flowing from the other pole to the inverter 220.

By disposing current sensors on both connection lines between the DC link and the inverter 220, i.e., by disposing the first current sensor 130 and the second current sensor 132 respectively, it is possible to check the equilibrium of the current flowing in three phases.

Figure 9:
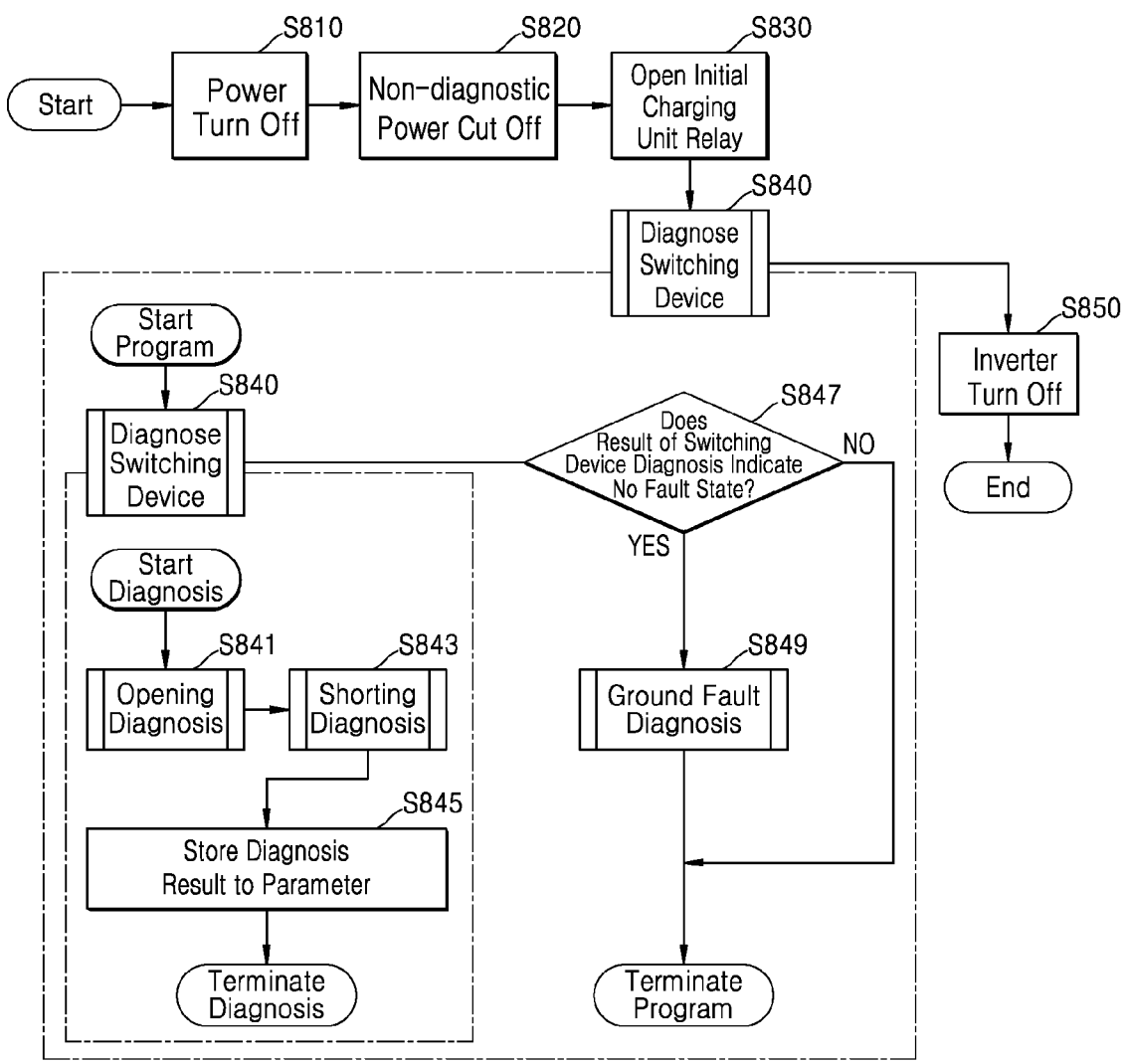
FIG. 9 is a view illustrating a method of diagnosing opening and shorting, and a grounding fault of a switching device according to an embodiment of the present disclosure.

FIG. 9 is a view illustrating a method of diagnosing opening and shorting, and a grounding fault of a switching device according to an embodiment of the present disclosure.

Figure 10:
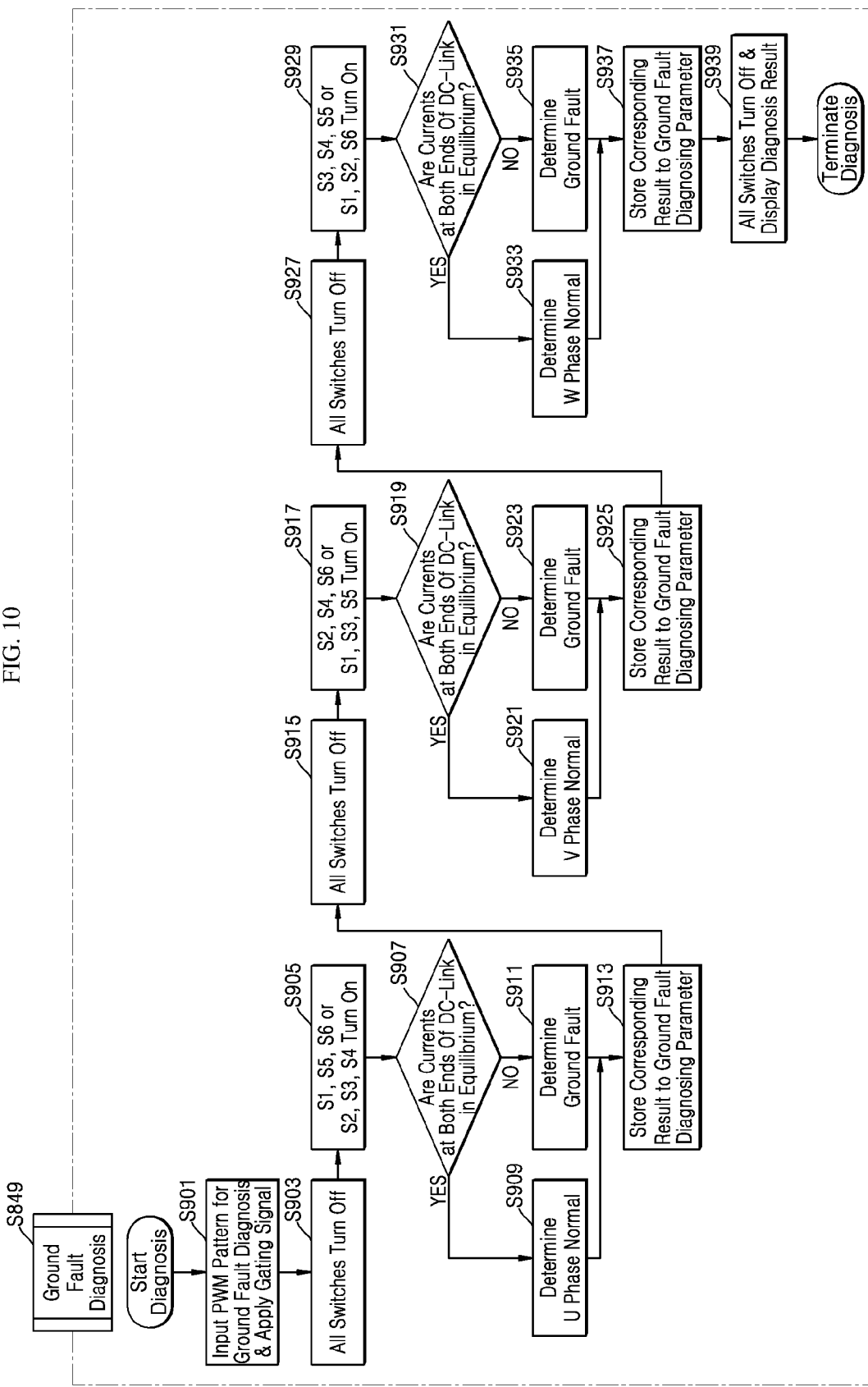
FIG. 10 is a detailed view illustrating a method of diagnosing a grounding fault according to an embodiment of the present disclosure.

The methods of diagnosing illustrated in FIGS. 9 and 10 may be performed by a diagnosing device of a three phase inverter according to an embodiment of the present disclosure. Therefore, in the present specification, the diagnosing methods in FIGS. 9 and 10 will be described mainly with reference to the components of the diagnosing device of a three phase inverter.

Referring to FIG. 9, at S810, the control unit 150 may cut off the power applied to the power system 300.

At S820, the control unit 150 may cut off the non-diagnostic power that is used for purposes other than diagnosis. The power used for purposes other than diagnosis may be, for example, a driving power for a fan and so on.

At S830, the control unit 150 may open the relay 124. Opening the relay 124 allows the current to flow through the initial charging resistor 122 to suppress an overcurrent that may flow when the switching devices Sa, Sb, or Sc are shorted.

At S840, the control unit 150 may diagnose the switching device. The control unit 150 may selectively drive the switching device to diagnose the state of the switching device according to whether the current is sensed or whether the current is equal to or greater than a predetermined value. The control unit 150 may diagnose the switching devices within a time period in which the power is cut off, the capacitor 110 is discharged, and the voltage sensed at the voltage detection unit 144 falls to or below the predetermined value. The control unit 150 may drive the switching devices with short pulses when diagnosing the switching devices.

At S841, the control unit 150 may diagnose whether or not the switching device is open, and at S843, the control unit 150 may diagnose to determine whether the switching device is shorted or not. The method of diagnosing opening and shorting has been described above in detail with reference to FIGS. 4 to 6.

At S845, the control unit 150 may store the result of diagnosis in the storage unit 170 as a switching device parameter.

At S847, the control unit 150 may determine presence or absence of a fault state according to a result of the switching device diagnosis. When there is no fault state, the process proceeds to operation of S849, and when there is a fault state, the diagnostics may be terminated.

At S849, the control unit 150 may diagnose a ground fault. The method of diagnosing a ground fault will be described in detail through FIG. 9.

At S850, the control unit 150 may cut off all the power supplied to the inverter after the diagnosis is completed.

FIG. 10 is a detailed view illustrating a method of diagnosing a grounding fault according to an embodiment of the present disclosure.

Referring to FIG. 10, at S901, the control unit 150 may input a PWM pattern for a ground fault diagnosis to apply a gating signal to the switching device. The gating signal to the switching device by the PWM pattern may be provided at S905 to S939, and operation at S901 may correspond to a start.

At S903, the control unit 150 may turn off all the switching devices.

At S905, the control unit 150 may selectively drive the three switching devices. At this time, the three switching devices S1, S5, and S6 or the three switching devices S2, S3, and S4 may be driven.

At S907, the control unit 150 may determine whether the current on both ends of the DC link, that is, the current sensed by the first current sensor 130 and the current sensed by the second current sensor 132 are in equilibrium. Upon determining equilibrium, the process proceeds to operation of S909, and upon failing to determine equilibrium, the process proceeds to operation of S911.

At S909, the control unit 150 may determine that the U phase does not have a ground fault.

At S911, the control unit 150 may determine a ground fault. However, in this stage, it is not yet possible to determine which of the phases has the ground fault. The control unit 150 may determine which phase has a ground fault by combining the results of determining the ground fault for all phases.

At S913, the control unit 150 may store the result of diagnosis in the storage unit 170 as a ground fault diagnosis parameter.

At S915, the control unit 150 may turn off all the switching devices.

At S917, the control unit 150 may selectively drive the three switching devices. At this time, the three switching devices S2, S4, and S6 or the three switching devices S1, S3, and S5 may be driven.

At S919, the control unit 150 may determine whether the current on both ends of the DC link, that is, the current sensed by the first current sensor 130 and the current sensed by the second current sensor 132 are in equilibrium. Upon determining equilibrium, the process proceeds to operation of S921, and upon failing to determine equilibrium, the process proceeds to operation of S923.

At S921, the control unit 150 may determine that the V phase does not have a ground fault.

At S923, the control unit 150 may determine a ground fault. However, in this stage, it is not yet possible to determine which of the phases has the ground fault. The control unit 150 may determine which phase has the ground fault by combining the results of determining the ground fault for all phases.

At S925, the control unit 150 may store the result of diagnosis in the storage unit 170 as a ground fault diagnosis parameter.

At S927, the control unit 150 may turn off all the switching devices.

At S929, the control unit 150 may selectively drive the three switching devices. At this time, the three switching devices S3, S4, and S5 or the three switching devices S1, S2, and S6 may be driven.

At S931, the control unit 150 may determine whether the current on both ends of the DC link, that is, the current sensed by the first current sensor 130 and the current sensed by the second current sensor 132 are in equilibrium. Upon determining equilibrium, the process proceeds to operation of S933, and upon failing to determine equilibrium, the process proceeds to operation of S935.

At S933, the control unit 150 may determine that the W phase does not have a ground fault.

At S935, the control unit 150 may determine that it is a ground fault. However, in this stage, it is not yet possible to determine which of the phases has the ground fault. The control unit 150 may determine which phase has the ground fault by combining the results of determining the ground fault for all phases.

At S937, the control unit 150 may store the result of diagnosis in the storage unit 170 as a ground fault diagnosis parameter.

At S939, the control unit 150 may turn off all the switching devices and display the result of the ground fault diagnosis on the display unit 180.

As described above with reference to FIG. 9, the control unit 150 may selectively drive the switching devices so that the DC link, the output line for one of the three phases and the output lines for the other two of the phases may form a closed circuit. For example, the control unit 150 may selectively drive the three switching devices S1, S5, and S6 or the three switching devices S2, S3, and S4 such that the DC link, the U phase, the power system 300, and the V and W phase form a closed circuit. After the controlling mentioned above, the control unit 150 may determine whether or not the currents at both ends of the DC link are in equilibrium to thus determine occurrence of a ground fault for each of the phases.

After the diagnosis of the ground fault, the method of determining the ground fault according to equilibrium may be performed according to [Table 5] below.

TABLE 5

| | Driven switching device | Equilibrium | Ground fault determination | | |
|---|---|---|---|---|---|
| | | | U phase | V phase | W phase |
| U phase determination | S1, S5,S6 or S2, S3, S4 | Equilibrium | X | O | X |
| | | | | X | O |
| | | | | X | X |
| | | No equilibrium | O | O | O |
| | | | | X | X |
| | | | X | O | O |
| V phase determination | S1, S3, S5 or S2, S4, S6 | Equilibrium | O | X | X |
| | | | X | | O |
| | | | X | | X |
| | | No equilibrium | O | O | O |
| | | | X | | X |
| | | | O | X | O |
| W phase determination | S1, S2, S6 or S3, S4, S5 | Equilibrium | O | X | X |
| | | | X | O | |
| | | | X | X | |
| | | No equilibrium | O | O | O |
| | | | X | X | |
| | | | O | O | |

In Table 5, O denotes a ground fault, and X denotes no ground fault, and when it is determined that one phase does not have a ground fault, there is a possibility that one of the other two phases has a ground fault. When diagnosing for all phases, it may be possible to determine whether or not each of the phases has a ground fault.

Although embodiments have been described in accordance with the present invention above, it will be understood by those skilled in the art that various changes in form and details may be made therein without departing from the spirit and scope of the disclosure as defined by the appended claims. Accordingly, the true scope of the present disclosure should be determined by the technical idea of the appended claims.

What is claimed is:
1. A device for diagnosing a three phase inverter, the device comprising:

a relay connected in series with a capacitor disposed on a DC link, wherein both ends of the DC link are respectively connected to lines connecting between a converter and an inverter;

an initial charging resistor connected in parallel to the relay;

the inverter comprising a plurality of switching devices for controlling a power supply to three phase output lines;

a current sensor disposed on a connection line connecting between the DC link and the inverter to sense a current; and a control unit configured to diagnose at least one of open-circuit fault and short-circuit fault of each of the plurality of switching devices, wherein the plurality of switching devices comprises:
   upper switching devices disposed between output lines for each of the three phases and a first pole of the capacitor, respectively; and
   lower switching devices disposed between the output lines for each of the three phases and a second pole opposite to the first pole of the capacitor, and wherein the control unit is further configured to:
   cut off a power being supplied from the inverter to a power system,
   supply a power being supplied from the capacitor, to the power system,
   sense a current through a first switching device of the plurality of switching devices based on the power applied to the power system,
   if a magnitude of the sensed current is equal to or larger than a predetermined value, identify that a second switching device arranged in a same column with the first switching device has a short-circuit fault while a voltage output from the capacitor is equal to or larger than a predetermined voltage, and
   display fault information on a display unit based on the identification.

2. The device of claim 1, wherein, after cutting off the power supplied to the power system being supplied with three phase power from the inverter, while the power is supplied from the capacitor disposed on the DC link, the control unit is further configured to diagnose at least one of opening and shorting of the switching device using the power of the capacitor.

3. The device of claim 1, wherein the control unit is further configured to selectively drive the plurality of switching devices so that the DC link, the output line for one of the three phases and the output line for another one of the phases form a closed circuit.

4. The device of claim 1, wherein the control unit is further configured to independently drive each of the plurality of switching devices to diagnose shorting of each of the plurality of switching devices according to whether the current is sensed or not.

5. The device of claim 4, wherein the control unit is further configured to drive one of the plurality of switching devices to determine whether the switching device connected to the same phase as the driven switching device driven is shorted or not according to whether a large current equal to or greater than a predetermined value is sensed or not.

* * * * *